US012803583B2

(12) United States Patent
Zhang et al.

(10) Patent No.: US 12,803,583 B2
(45) Date of Patent: Nov. 17, 2026

(54) METHOD, AN APPARATUS AND A COMPUTER PROGRAM PRODUCT FOR VIDEO ENCODING AND VIDEO DECODING

(71) Applicant: Nokia Technologies Oy, Espoo (FI)

(72) Inventors: Honglei Zhang, Tampere (FI); Francesco Cricrì, Tampere (FI); Nam Hai Le, Tampere (FI); Ruiying Yang, Tampere (FI)

(73) Assignee: Nokia Technologies Oy, Espoo (FI)

( * ) Notice: Subject to any disclaimer, the term of this patent is extended or adjusted under 35 U.S.C. 154(b) by 80 days.

(21) Appl. No.: 19/111,636

(22) PCT Filed: Jun. 15, 2023

(86) PCT No.: PCT/EP2023/066031
§ 371 (c)(1),
(2) Date: Mar. 13, 2025

(87) PCT Pub. No.: WO2024/056219
PCT Pub. Date: Mar. 21, 2024

(65) Prior Publication Data

US 2026/0088828 A1 Mar. 26, 2026

(30) Foreign Application Priority Data

Sep. 15, 2022 (FI) ..................................... 20225802

(51) Int. Cl.
*H03M 7/02* (2006.01)
*G06N 3/0455* (2023.01)
(Continued)

(52) U.S. Cl.
CPC ............ *H03M 7/02* (2013.01); *G06N 3/0464* (2023.01); *H04N 19/124* (2014.11); *G06N 3/0455* (2023.01); *G06N 3/084* (2013.01)

(58) Field of Classification Search
CPC ..... H03M 7/02; G06N 3/0464; G06N 3/0455; G06N 3/084; H04N 19/124
(Continued)

(56) References Cited

U.S. PATENT DOCUMENTS 11,113,601 B1 * 9/2021 Xiao ........................ G06N 3/04
11,468,303 B2 * 10/2022 Mellempudi ........... G06F 5/012
(Continued)

FOREIGN PATENT DOCUMENTS

EP 4156691 A2 3/2023
WO 2021179281 A1 9/2021

OTHER PUBLICATIONS

"Video coding for low bit rate communication", Series H: Audiovisual and Multimedia Systems, Infrastructure of audiovisual services—Coding of moving video, ITU-T Recommendation H.263, Jan. 2005, 226 pages.

(Continued)

*Primary Examiner* — Khai M Nguyen
(74) *Attorney, Agent, or Firm* — Nokia Technologies Oy

(57) ABSTRACT

The embodiments relate to a method comprising processing data in a neural network-based coding system comprising at least one floating-point neural network; obtaining an input tensor representing an input media; convolving the input tensor by one or more filters; wherein the method further comprises scaling elements of an input tensor by one or more input scaling factors; scaling weight elements of the one or more filters by one or more weight scaling factors; rounding the scaled input elements and the scaled weight elements to nearest integers; performing the convolution in integer domain to result in one or more output tensors; converting the one or more output tensors to a floating-point representation; scaling the floating-point representation by inverse of a product of the input scaling factor and the weight scaling factor for each output tensor; and generating an output tensor of said one or more output tensors.

20 Claims, 6 Drawing Sheets

(51) Int. Cl.
*G06N 3/0464* (2023.01)
*G06N 3/084* (2023.01)
*H04N 19/124* (2014.01)

(58) Field of Classification Search
USPC ............................................. 341/50, 67, 87
See application file for complete search history.

(56) References Cited

U.S. PATENT DOCUMENTS

| | | | |
|---|---|---|---|
| 2019/0294413 | A1 | 9/2019 | Vantrease et al. |
| 2019/0340500 | A1 | 11/2019 | Olmschenk |
| 2021/0358180 | A1 | 11/2021 | Johnston et al. |
| 2021/0406686 | A1 | 12/2021 | Xiao et al. |
| 2022/0067530 | A1 | 3/2022 | Khailany et al. |
| 2022/0103839 | A1 | 3/2022 | Van Rozendaal et al. |
| 2023/0412806 | A1 | 12/2023 | Yang et al. |

OTHER PUBLICATIONS

"Advanced video coding for generic audiovisual services", Series H: Audiovisual And Multimedia Systems, Infrastructure of audiovisual services—Coding of moving video, ITU-T Recommendation H.264, Aug. 2021, 844 pages.

"High efficiency video coding", Series H: Audiovisual And Multimedia Systems, Infrastructure of audiovisual services—Coding of moving video, Recommendation ITU-T H.265, Aug. 2021, 716 pages.

"Versatile video coding", Series H: Audiovisual and Multimedia Systems, Infrastructure of audiovisual services—Coding of moving video, Recommendation ITU-T H.266, Aug. 2020, 516 pages.

"Versatile supplemental enhancement information messages for coded video bitstreams", Series H: Audiovisual and Multimedia Systems, Infrastructure of audiovisual services—Coding of moving video, Recommendation ITU-T H.274, Aug. 2020, 86 pages.

Finland Application No. 20225328, "A Method, an Apparatus and a Computer Program Product for Video Encoding and Video Decoding", filed on Apr. 19, 2022, pp. 1-67.

"IEEE Standard for Floating-Point Arithmetic", IEEE Computer Society, IEEE Std 754™—2019, Jun. 2019, 84 pages.

Office Action received for corresponding Finnish Patent Application No. 20225802, dated Mar. 6, 2023, 13 pages.

Zhang et al., "[VCM] Response to the CfP of the VCM by Nokia", ISO/IEC JTC 1/SC, 29/WG 4, Nokia, m61455, Oct. 2022, pp. 1-25.

International Search Report and Written Opinion received for corresponding Patent Cooperation Treaty Application No. PCT/EP2023/066031, dated Oct. 2, 2023, 14 pages.

Zhong et al., "Towards Lower Bit Multiplication for Convolutional Neural Network Training" arXiv, Jun. 4, 2020, 12 pages.

* cited by examiner

METHOD, AN APPARATUS AND A COMPUTER PROGRAM PRODUCT FOR VIDEO ENCODING AND VIDEO DECODING

RELATED APPLICATION

This application claims priority to PCT Patent Application No. PCT/EP2023/066031, filed 15 Jun. 2023, which claims priority from Finland Application No. 20225802, filed on 15 Sep. 2022, which is incorporated herein by reference in its entirety.

The project leading to this application has received funding from the ECSEL Joint Undertaking (JU) under grant agreement No 876019. The JU receives support from the European Union's Horizon 2020 research and innovation programme and Germany, Netherlands, Austria, Romania, France, Sweden, Cyprus, Greece, Lithuania, Portugal, Italy, Finland, Turkey.

TECHNICAL FIELD

The present solution generally relates to neural network-based video coding system.

BACKGROUND

One of the elements in image and video compression is to compress data while maintaining the quality to satisfy human perceptual ability. However, in recent development of machine learning, machines can replace humans when analyzing data for example in order to detect events and/or objects in video/image. The present embodiments can be utilized in Video Coding for Machines, but also in other use cases.

SUMMARY

The scope of protection sought for various embodiments of the invention is set out by the independent claims. The embodiments and features, if any, described in this specification that do not fall under the scope of the independent claims are to be interpreted as examples useful for understanding various embodiments of the invention.

Various aspects include a method, an apparatus and a computer readable medium comprising a computer program stored therein, which are characterized by what is stated in the independent claims. Various embodiments are disclosed in the dependent claims.

According to a first aspect, there is provided an apparatus comprising means for means for processing data in a convolutional neural network-based coding system comprising at least one floating-point neural network; means for obtaining an input tensor representing an input media; means for convolving the input tensor by one or more filters; wherein the apparatus further comprises means for scaling elements of an input tensor by one or more input scaling factors; means for scaling weight elements of the one or more filters by one or more weight scaling factors; means for rounding the scaled input elements and the scaled weight elements to nearest integers; means for performing the convolution in integer domain to result in one or more output tensors; means for converting the one or more output tensors to a floating-point representation; means for scaling the floating-point representation by inverse of a product of the input scaling factor and the weight scaling factor for each output tensor; and means for generating an output tensor of said one or more output tensors.

According to a second aspect, there is provided a method comprising processing data in a convolutional neural network-based coding system comprising at least one floating-point neural network; obtaining an input tensor representing an input media; convolving the input tensor by one or more filters; wherein the method further comprises scaling elements of an input tensor by one or more input scaling factors; scaling weight elements of the one or more filters by one or more weight scaling factors; rounding the scaled input elements and the scaled weight elements to nearest integers; performing the convolution in integer domain to result in one or more output tensors; converting the one or more output tensors to a floating-point representation; scaling the floating-point representation by inverse of a product of the input scaling factor and the weight scaling factor for each output tensor; and generating an output tensor of said one or more output tensors.

According to a third aspect, there is provided an apparatus comprising at least one processor, memory including computer program code, the memory and the computer program code configured to, with the at least one processor, cause the apparatus to perform at least the following: process data in a convolutional neural network-based coding system comprising at least one floating-point neural network; obtain an input tensor representing an input media; convolve the input tensor by one or more filters; wherein the apparatus is further caused to scale elements of an input tensor by one or more input scaling factors; scale weight elements of the one or more filters by one or more weight scaling factors; round the scaled input elements and the scaled weight elements to nearest integers; perform the convolution in integer domain to result in one or more output tensors; convert the one or more output tensors to a floating-point representation; scale the floating-point representation by inverse of a product of the input scaling factor and the weight scaling factor for each output tensor; and generate an output tensor of said one or more output tensors.

According to a fourth aspect, there is provided a computer program product comprising computer program code configured to, when executed on at least one processor, cause an apparatus or a system to process data in a convolutional neural network-based coding system comprising at least one floating-point neural network; obtain an input tensor representing an input media; convolve the input tensor by one or more filters; wherein the apparatus is further caused to scale elements of an input tensor by one or more input scaling factors; scale weight elements of the one or more filters by one or more weight scaling factors; round the scaled input elements and the scaled weight elements to nearest integers; perform the convolution in integer domain to result in one or more output tensors; convert the one or more output tensors to a floating-point representation; scale the floating-point representation by inverse of a product of the input scaling factor and the weight scaling factor for each output tensor; and generate an output tensor of said one or more output tensors.

According to an embodiment, precision allocation factor is used for allocating precision levels for the elements of the input tensor and the weight elements.

According to an embodiment, the precision allocation factor is determined based at least on the maximum value of elements in the input tensor, the mean value of the absolute values of the elements in the input tensor and the number of elements in the weight tensor.

According to an embodiment, the precision allocation factor is determined based at least on the number of weight elements and a predefined constant number.

According to an embodiment, an input tensor is partitioned into multiple subtensors and a weight tensor is partitioned into multiple weight subtensors, wherein the multiple subtensors represent the elements of the input tensors, and wherein the multiple weight subtensors represent the weight elements, whereupon the convolution operation is performed for each pair of input subtensor and weight subtensor in integer domain to result in one or more output subtensors, whereupon the one or more output subtensors are converted to a floating-point representation, and the output subtensors are combined into an output tensor.

According to an embodiment, the input scaling factor and the weight scaling factor is derived from precision allocation factor for each pair of the subtensors.

According to an embodiment, the input tensor is partitioned according to the ratio of the maximum value of the absolute values of the input tensor and the mean value of the absolute values of the input tensor and a predefined threshold value; and the maximum value of the absolute values of the input tensor and a predefined threshold value.

According to an embodiment, the computer program product is embodied on a non-transitory computer readable medium.

DESCRIPTION OF THE DRAWINGS

In the following, various embodiments will be described in more detail with reference to the appended drawings, in which.

DESCRIPTION OF EXAMPLE EMBODIMENTS

Figure 1:
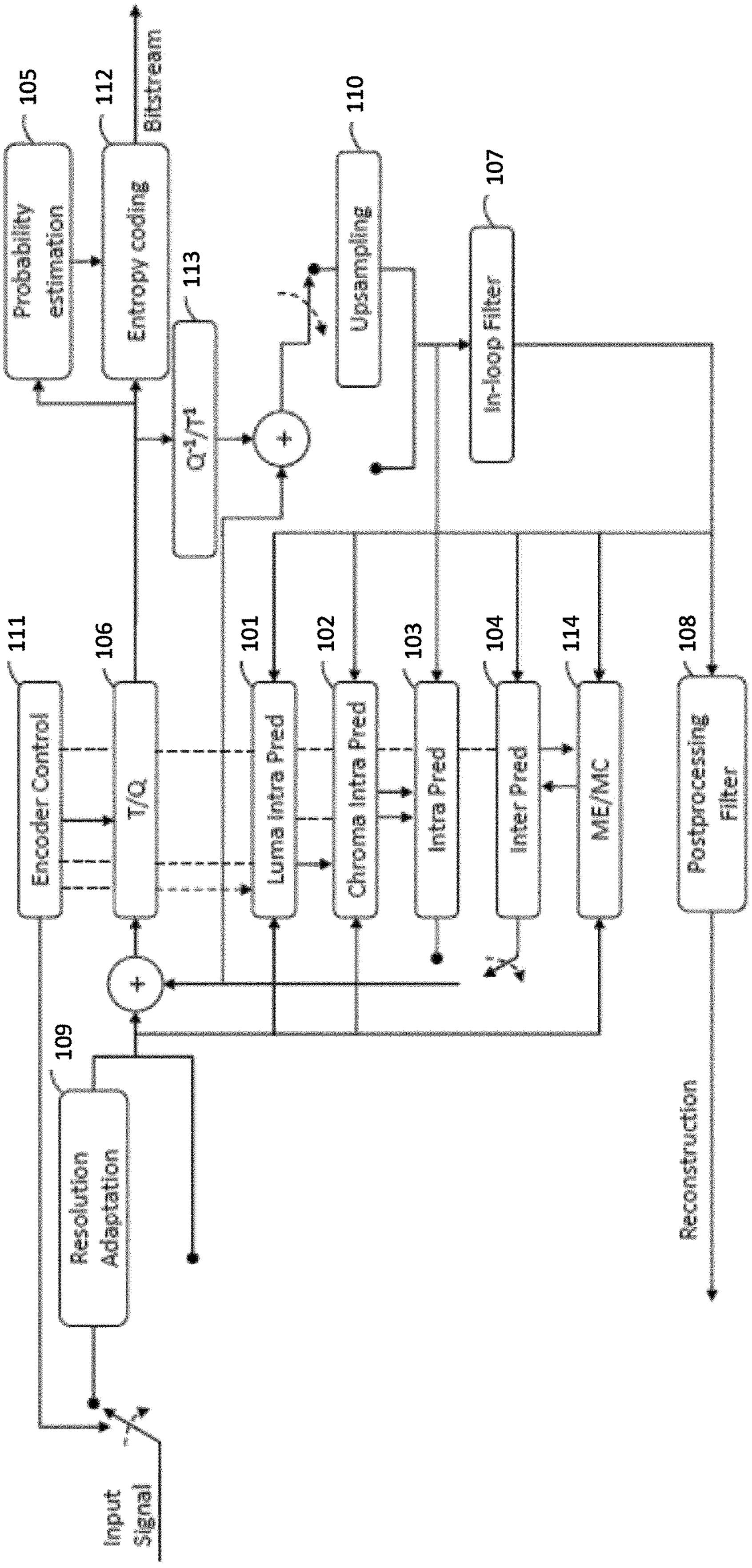
FIG. 1 shows an example of a codec with neural network (NN) components.

The present embodiments relate to a convolution operation in quantized domain. The convolution is used as an example to describe the present embodiments, however, the embodiments may be applied to other operations, for example, fully connected layers in a NN, matrix multiplication, and average pooling.

The following description and drawings are illustrative and are not to be construed as unnecessarily limiting. The specific details are provided for a thorough understanding of the disclosure. However, in certain instances, well-known or conventional details are not described in order to avoid obscuring the description. References to one or an embodiment in the present disclosure can be, but not necessarily are, references to the same embodiment and such references mean at least one of the embodiments.

Reference in this specification to "one embodiment" or "an embodiment" means that a particular feature, structure, or characteristic described in connection with the embodiment is included in at least one embodiment of the disclosure.

Before discussing the present embodiments in more detailed manner, a short reference to related technology is given.

In the context of machine learning, a neural network (NN) is a computation graph consisting of several layers of computation. Each layer consists of one or more units, where each unit performs an elementary computation. A unit is connected to one or more other units, and the connection may have associated with a weight. The weight may be used for scaling the signal passing through the associated connection. Weights are learnable parameters, i.e., values which can be learned from training data. There may be other learnable parameters, such as those of batch-normalization layers.

Two of the most widely used architectures for neural networks are feed-forward and recurrent architectures. Feed-forward neural networks are such that there is no feedback loop: each layer takes input from one or more of the layers before and provides its output as the input for one or more of the subsequent layers. Also, units inside a certain layer take input from units in one or more of preceding layers, and provide output to one or more of following layers.

Initial layers (those close to the input data) extract semantically low-level features such as edges and textures in images, and intermediate and final layers extract more high-level features. After the feature extraction layers there may be one or more layers performing a certain task, such as classification, semantic segmentation, object detection, denoising, style transfer, super-resolution, etc. In recurrent neural nets, there is a feedback loop, so that the network becomes stateful, i.e., it is able to memorize information or a state.

Neural networks are being utilized in an ever-increasing number of applications for many different types of device, such as mobile phones. Examples include image and video analysis and processing, social media data analysis, device usage data analysis, etc.

One of the important properties of neural networks (and other machine learning tools) is that they are able to learn properties from input data, either in supervised way or in unsupervised way. Such learning is a result of a training algorithm, or of a meta-level neural network providing the training signal.

In general, the training algorithm consists of changing some properties of the neural network so that its output is as close as possible to a desired output. For example, in the case of classification of objects in images, the output of the neural network can be used to derive a class or category index which indicates the class or category that the object in the input image belongs to. Training usually happens by minimizing or decreasing the output's error, also referred to as the loss. Examples of losses are mean squared error, cross-entropy, etc. In recent deep learning techniques, training is an iterative process, where at each iteration the algorithm modifies the weights of the neural net to make a gradual improvement of the network's output, i.e., to gradually decrease the loss.

In this description, terms "model" and "neural network" are used interchangeably, and also the weights of neural networks are sometimes referred to as learnable parameters or simply as parameters.

Training a neural network is an optimization process, but the final goal is different from the typical goal of optimization. In optimization, the only goal is to minimize a function. In machine learning, the goal of the optimization or training process is to make the model learn the properties of the data distribution from a limited training dataset. In other words, the goal is to learn to use a limited training dataset in order to learn to generalize to previously unseen data, i.e., data which was not used for training the model. This is usually referred to as generalization. In practice, data may be split into at least two sets, the training set and the validation set. The training set is used for training the network, i.e., to modify its learnable parameters in order to minimize the loss. The validation set is used for checking the performance of the network on data which was not used to minimize the loss, as an indication of the final performance of the model. In particular, the errors on the training set and on the validation set are monitored during the training process to understand the following things:

- If the network is learning at all—in this case, the training set error should decrease, otherwise the model is in the regime of underfitting.
- If the network is learning to generalize—in this case, also the validation set error needs to decrease and to be not too much higher than the training set error. If the training set error is low, but the validation set error is much higher than the training set error, or it does not decrease, or it even increases, the model is in the regime of overfitting. This means that the model has just memorized the training set's properties and performs well only on that set, but performs poorly on a set not used for tuning its parameters.

Lately, neural networks have been used for compressing and de-compressing data such as images, i.e., in an image codec. The most widely used architecture for realizing one component of an image codec is the auto-encoder, which is a neural network consisting of two parts: a neural encoder and a neural decoder. The neural encoder takes as input an image and produces a code which requires less bits than the input image. This code may be obtained by applying a binarization or quantization process to the output of the encoder. The neural decoder takes in this code and reconstructs the image which was input to the neural encoder.

Such neural encoder and neural decoder may be trained to minimize a combination of bitrate and distortion, where the distortion may be based on one or more of the following metrics: Mean Squared Error (MSE), Peak Signal-to-Noise Ratio (PSNR), Structural Similarity Index Measure (SSIM), or similar. These distortion metrics are meant to be correlated to the human visual perception quality, so that minimizing or maximizing one or more of these distortion metrics results into improving the visual quality of the decoded image as perceived by humans.

Video codec comprises an encoder that transforms the input video into a compressed representation suited for storage/transmission and a decoder that can decompress the compressed video representation back into a viewable form. An encoder may discard some information in the original video sequence in order to represent the video in a more compact form (that is, at lower bitrate).

Hybrid video codecs, for example ITU-T H.263 and H.264, may encode the video information in two phases. Firstly pixel values in a certain picture area (or "block") are predicted for example by motion compensation means (finding and indicating an area in one of the previously coded video frames that corresponds closely to the block being coded) or by spatial means (using the pixel values around the block to be coded in a specified manner). Secondly the prediction error, i.e. the difference between the predicted block of pixels and the original block of pixels, is coded. This may be done by transforming the difference in pixel values using a specified transform (e.g. Discrete Cosine Transform (DCT) or a variant of it), quantizing the coefficients and entropy coding the quantized coefficients. By varying the fidelity of the quantization process, encoder can control the balance between the accuracy of the pixel representation (picture quality) and size of the resulting coded video representation (file size or transmission bitrate).

Inter prediction, which may also be referred to as temporal prediction, motion compensation, or motion-compensated prediction, exploits temporal redundancy. In inter prediction the sources of prediction are previously decoded pictures.

Intra prediction utilizes the fact that adjacent pixels within the same picture are likely to be correlated. Intra prediction can be performed in spatial or transform domain, i.e., either sample values or transform coefficients can be predicted. Intra prediction is typically exploited in intra coding, where no inter prediction is applied.

One outcome of the coding procedure is a set of coding parameters, such as motion vectors and quantized transform coefficients. Many parameters can be entropy-coded more efficiently if they are predicted first from spatially or temporally neighboring parameters. For example, a motion vector may be predicted from spatially adjacent motion vectors and only the difference relative to the motion vector predictor may be coded. Prediction of coding parameters and intra prediction may be collectively referred to as in-picture prediction.

The decoder reconstructs the output video by applying prediction means similar to the encoder to form a predicted representation of the pixel blocks (using the motion or spatial information created by the encoder and stored in the compressed representation) and prediction error decoding (inverse operation of the prediction error coding recovering the quantized prediction error signal in spatial pixel domain). After applying prediction and prediction error decoding means, the decoder sums up the prediction and prediction error signals (pixel values) to form the output video frame. The decoder (and encoder) can also apply additional filtering means to improve the quality of the output video before passing it for display and/or storing it as prediction reference for the forthcoming frames in the video sequence.

In video codecs, the motion information may be indicated with motion vectors associated with each motion compensated image block. Each of these motion vectors represents the displacement of the image block in the picture to be coded (in the encoder side) or decoded (in the decoder side) and the prediction source block in one of the previously coded or decoded pictures. In order to represent motion vectors efficiently, those may be coded differentially with respect to block specific predicted motion vectors. In video codecs, the predicted motion vectors may be created in a predefined way, for example calculating the median of the encoded or decoded motion vectors of the adjacent blocks. Another way to create motion vector predictions is to generate a list of candidate predictions from adjacent blocks and/or co-located blocks in temporal reference pictures and signaling the chosen candidate as the motion vector predictor. In addition to predicting the motion vector values, the reference index of previously coded/decoded picture can be predicted. The reference index is typically predicted from adjacent blocks and/or or co-located blocks in temporal reference picture. Moreover, high efficiency video codecs can employ an additional motion information coding/decoding mechanism, often called merging/merge mode, where all the motion field information, which includes motion vector and corresponding reference picture index for each available reference picture list, is predicted and used without any modification/correction. Similarly, predicting the motion field information may be carried out using the motion field information of adjacent blocks and/or co-located blocks in temporal reference pictures and the used motion field information is signaled among a list of motion field candidate list filled with motion field information of available adjacent/co-located blocks.

In video codecs the prediction residual after motion compensation may be first transformed with a transform kernel (like DCT) and then coded. The reason for this is that often there still exists some correlation among the residual and transform can in many cases help reduce this correlation and provide more efficient coding.

Video encoders may utilize Lagrangian cost functions to find optimal coding modes, e.g. the desired Macroblock mode and associated motion vectors. This kind of cost function uses a weighting factor A to tie together the (exact or estimated) image distortion due to lossy coding methods and the (exact or estimated) amount of information that is required to represent the pixel values in an image area:

$$C = D + \lambda R$$

where C is the Lagrangian cost to be minimized, D is the image distortion (e.g. Mean Squared Error) with the mode and motion vectors considered, and R the number of bits needed to represent the required data to reconstruct the image block in the decoder (including the amount of data to represent the candidate motion vectors). Video coding specifications may enable the use of supplemental enhancement information (SEI) messages or alike. Some video coding specifications include SEI NAL units, and some video coding specifications contain both prefix SEI NAL units and suffix SEI NAL units, where the former type can start a picture unit or alike and the latter type can end a picture unit or alike. An SEI NAL unit contains one or more SEI messages, which are not required for the decoding of output pictures but may assist in related processes, such as picture output timing, post-processing of decoded pictures, rendering, error detection, error concealment, and resource reservation. Several SEI messages are specified in H.264/AVC, H.265/HEVC, H.266/VVC, and H.274/VSEI standards, and the user data SEI messages enable organizations and companies to specify SEI messages for their own use. The standards may contain the syntax and semantics for the specified SEI messages but a process for handling the messages in the recipient might not be defined. Consequently, encoders may be required to follow the standard specifying a SEI message when they create SEI message(s), and decoders might not be required to process SEI messages for output order conformance. One of the reasons to include the syntax and semantics of SEI messages in standards is to allow different system specifications to interpret the supplemental information identically and hence interoperate. It is intended that system specifications can require the use of particular SEI messages both in the encoding end and in the decoding end, and additionally the process for handling particular SEI messages in the recipient can be specified.

Image and video codecs may use a set of filters to enhance the visual quality of the predicted visual content and can be applied either in-loop or out-of-loop, or both. In the case of in-loop filters, the filter applied on one block in the currently-encoded frame will affect the encoding of another block in the same frame and/or in another frame which is predicted from the current frame. An in-loop filter can affect the bitrate and/or the visual quality. In fact, an enhanced block will cause a smaller residual (difference between original block and predicted-and-filtered block), thus requiring less bits to be encoded. An out-of-the loop filter will be applied on a frame after it has been reconstructed, the filtered visual content won't be as a source for prediction, and thus it may only impact the visual quality of the frames that are output by the decoder.

Recently, neural networks (NNs) have been used in the context of image and video compression, by following mainly two approaches.

In one approach, NNs are used to replace one or more of the components of a traditional codec such as VVC/H.266. Here, term "traditional" refers to those codecs whose components and their parameters may not be learned from data. Examples of such components are:

- Additional in-loop filter, for example by having the NN as an additional in-loop filter with respect to the traditional loop filters.
- Single in-loop filter, for example by having the NN replacing all traditional in-loop filters.
- Intra-frame prediction.
- Inter-frame prediction.
- Transform and/or inverse transform.
- Probability model for the arithmetic codec.
- Etc.

FIG. 1 illustrates examples of functioning of NNs as components of a traditional codec's pipeline, in accordance with an embodiment. In particular, FIG. 1 illustrates an encoder, which also includes a decoding loop. FIG. 1 is shown to include components described below:

- A luma intra pred block or circuit 101. This block or circuit performs intra prediction in the luma domain, for example, by using already reconstructed data from the same frame. The operation of the luma intra pred block or circuit 101 may be performed by a deep neural network such as a convolutional auto-encoder.
- A chroma intra pred block or circuit 102. This block or circuit performs intra prediction in the chroma domain, for example, by using already reconstructed data from the same frame. The chroma intra pred block or circuit 102 may perform cross-component prediction, for example, predicting chroma from luma. The operation of the chroma intra pred block or circuit 102 may be performed by a deep neural network such as a convolutional auto-encoder.
- An intra pred block or circuit 103 and inter-pred block or circuit 104. These blocks or circuit perform intra prediction and inter-prediction, respectively. The intra pred block or circuit 103 and the inter-pred block or circuit 104 may perform the prediction on all components, for example, luma and chroma. The operations of the intra pred block or circuit 103 and inter-pred block or circuit 104 may be performed by two or more deep neural networks such as convolutional auto-encoders.
- A probability estimation block or circuit 105 for entropy coding. This block or circuit performs prediction of probability for the next symbol to encode or decode, which is then provided to the entropy coding module 112, such as the arithmetic coding module, to encode or decode the next symbol. The operation of the probability estimation block or circuit 105 may be performed by a neural network.
- A transform and quantization (T/Q) block or circuit 106. These are actually two blocks or circuits. The transform and quantization block or circuit 106 may perform a transform of input data to a different domain, for example, the FFT transform would transform the data to frequency domain. The transform and quantization block or circuit 106 may quantize its input values to a smaller set of possible values. In the decoding loop, there may be inverse quantization block or circuit and inverse transform block or circuit 113. One or both of the transform block or circuit and quantization block or circuit may be replaced by one or two or more neural networks. One or both of the inverse transform block or circuit and inverse quantization block or circuit 113 may be replaced by one or two or more neural networks.

An in-loop filter block or circuit 107. Operations of the in-loop filter block or circuit 107 is performed in the decoding loop, and it performs filtering on the output of the inverse transform block or circuit, or anyway on the reconstructed data, in order to enhance the reconstructed data with respect to one or more predetermined quality metrics. This filter may affect both the quality of the decoded data and the bitrate of the bitstream output by the encoder. The operation of the in-loop filter block or circuit 107 may be performed by a neural network, such as a convolutional auto-encoder. In examples, the operation of the in-loop filter may be performed by multiple steps or filters, where the one or more steps may be performed by neural networks.

A postprocessing filter block or circuit 108. The postprocessing filter block or circuit 108 may be performed only at decoder side, as it may not affect the encoding process. The postprocessing filter block or circuit 108 filters the reconstructed data output by the in-loop filter block or circuit 107, in order to enhance the reconstructed data. The postprocessing filter block or circuit 108 may be replaced by a neural network, such as a convolutional auto-encoder.

A resolution adaptation block or circuit 109: this block or circuit may downsample the input video frames, prior to encoding. Then, in the decoding loop, the reconstructed data may be upsampled, by the upsampling block or circuit 110, to the original resolution. The operation of the resolution adaptation block or circuit 109 block or circuit may be performed by a neural network such as a convolutional auto-encoder.

An encoder control block or circuit 111. This block or circuit performs optimization of encoder's parameters, such as what transform to use, what quantization parameters (QP) to use, what intra-prediction mode (out of N intra-prediction modes) to use, and the like. The operation of the encoder control block or circuit 111 may be performed by a neural network, such as a classifier convolutional network, or such as a regression convolutional network.

An ME/MC block or circuit 114 performs motion estimation and/or motion compensation, which are two key operations to be performed when performing inter-frame prediction. ME/MC stands for motion estimation/motion compensation.

Figure 2:
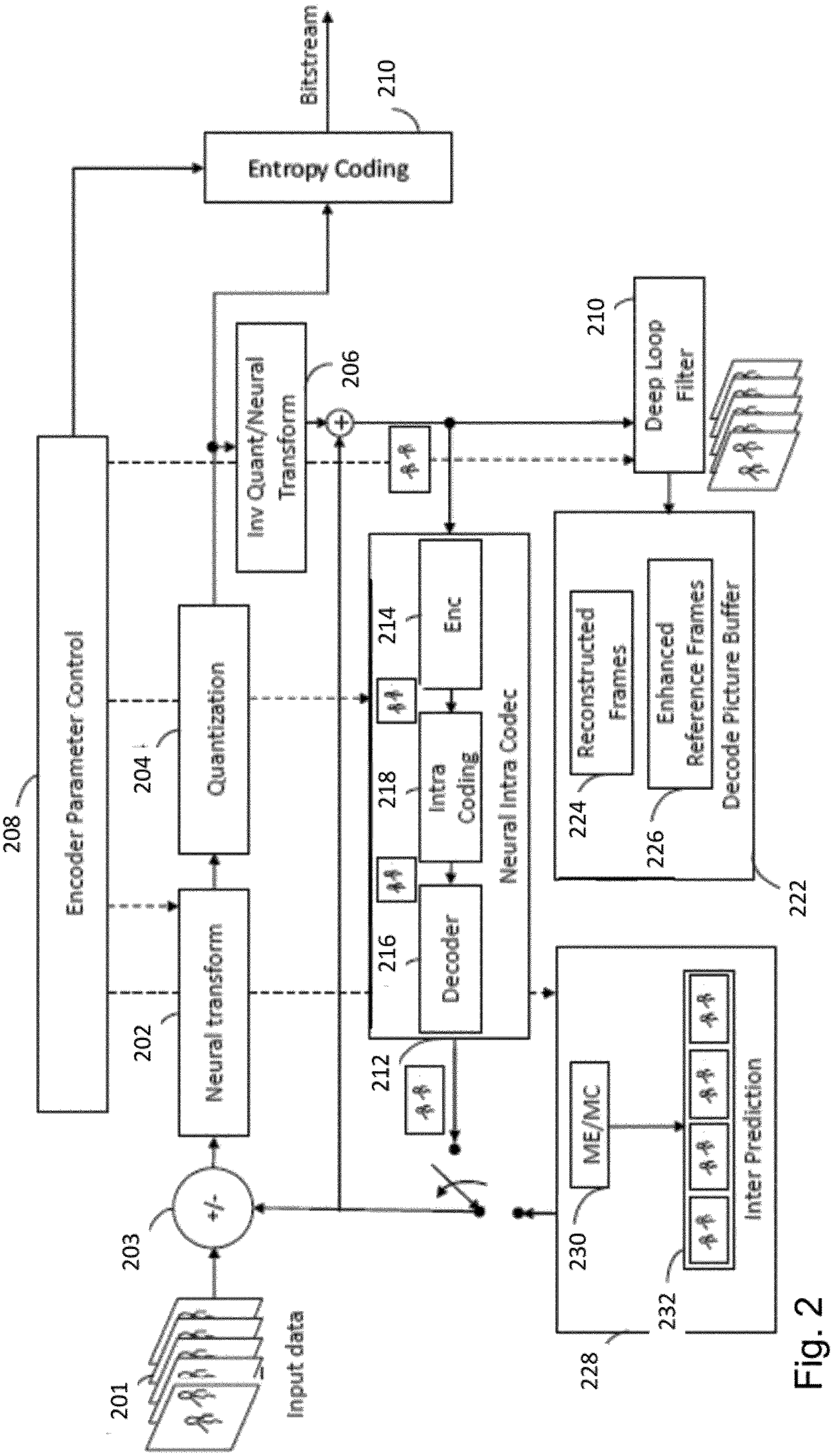
FIG. 2 shows another example of a video coding system with neural network components.

In another approach, commonly referred to as "end-to-end learned compression", NNs are used as the main components of the image/video codecs. In this second approach, there are two main options:

Option 1: re-use the video coding pipeline but replace most or all the components with NNs. Referring to FIG. 2, it illustrates an example of modified video coding pipeline based on a neural network, in accordance with an embodiment. An example of neural network may include, but is not limited to, a compressed representation of a neural network. FIG. 2 is shown to include following components:

A neural transform block or circuit 202: this block or circuit transforms the output of a summation/subtraction operation 203 to a new representation of that data, which may have lower entropy and thus be more compressible.

A quantization block or circuit 204: this block or circuit quantizes an input data 201 to a smaller set of possible values.

An inverse transform and inverse quantization blocks or circuits 206. These blocks or circuits perform the inverse or approximately inverse operation of the transform and the quantization, respectively.

An encoder parameter control block or circuit 208. This block or circuit may control and optimize some or all the parameters of the encoding process, such as parameters of one or more of the encoding blocks or circuits.

An entropy coding block or circuit 210. This block or circuit may perform lossless coding, for example based on entropy. One popular entropy coding technique is arithmetic coding.

A neural intra-codec block or circuit 212. This block or circuit may be an image compression and decompression block or circuit, which may be used to encode and decode an intra frame. An encoder 214 may be an encoder block or circuit, such as the neural encoder part of an auto-encoder neural network. A decoder 216 may be a decoder block or circuit, such as the neural decoder part of an auto-encoder neural network. An intra-coding block or circuit 218 may be a block or circuit performing some intermediate steps between encoder and decoder, such as quantization, entropy encoding, entropy decoding, and/or inverse quantization.

A deep loop filter block or circuit 220. This block or circuit performs filtering of reconstructed data, in order to enhance it.

A decode picture buffer block or circuit 222. This block or circuit is a memory buffer, keeping the decoded frame, for example, reconstructed frames 224 and enhanced reference frames 226 to be used for inter prediction.

An inter-prediction block or circuit 228. This block or circuit performs inter-frame prediction, for example, predicts from frames, for example, frames 232, which are temporally nearby. An ME/MC 230 performs motion estimation and/or motion compensation, which are two key operations to be performed when performing inter-frame prediction. ME/MC stands for motion estimation/motion compensation.

Option 2: re-design the whole pipeline, as follows. An example of option 2 is described in detail in FIG. 3:

Encoder NN: performs a non-linear transform

Quantization and lossless encoding of the encoder NN's output.

Lossless decoding and dequantization.

Decoder NN: performs a non-linear inverse transform.

Figure 3:
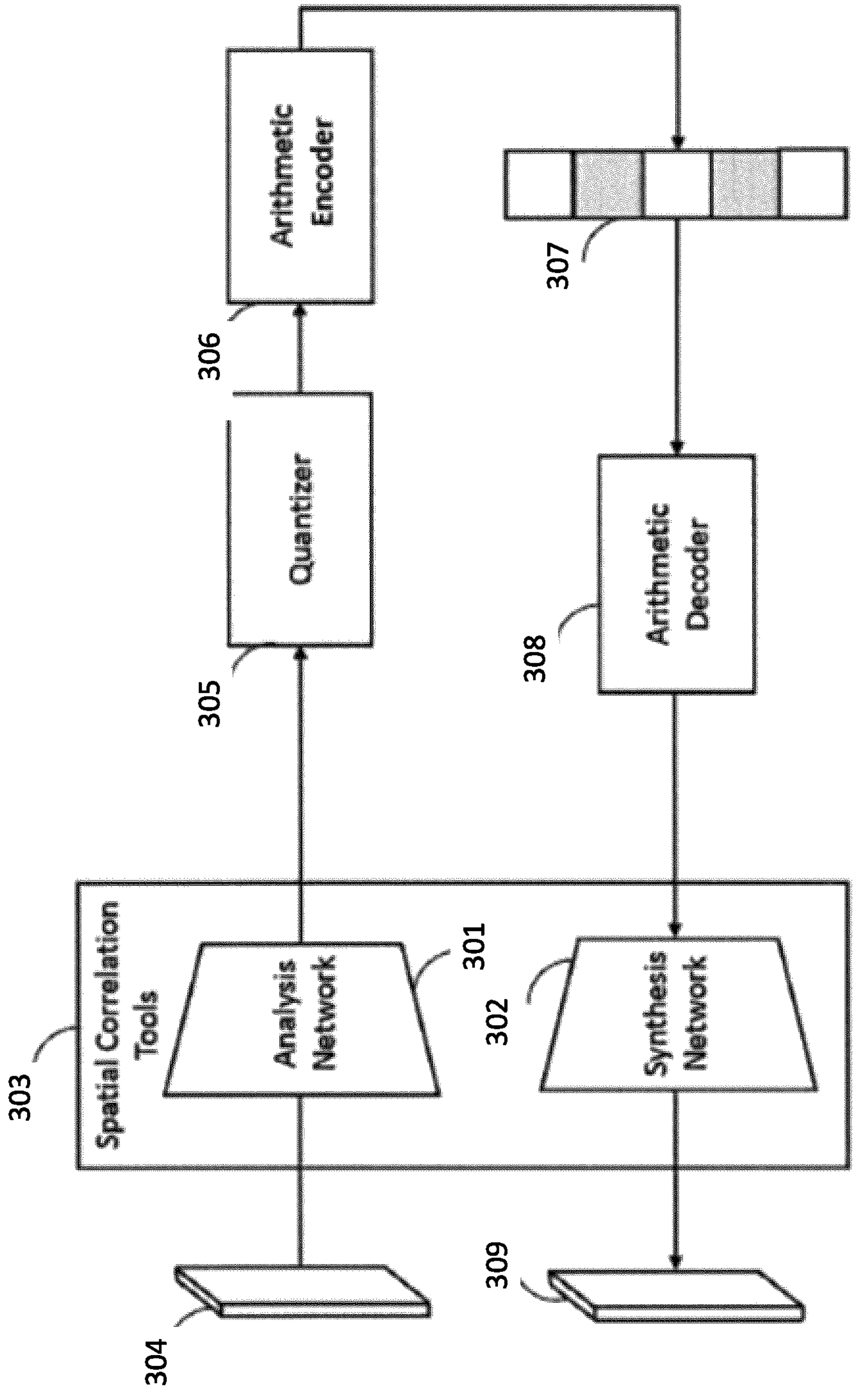
FIG. 3 shows an example of a neural auto-encoder architecture.

FIG. 3 depicts an encoder and a decoder NNs being parts of a neural auto-encoder architecture, in accordance with an example. In FIG. 3, the Analysis Network 301 is an Encoder NN, and the Synthesis Network 302 is the Decoder NN, which may together be referred to as spatial correlation tools 303, or as neural auto-encoder.

In the Option 2, the input data 304 is analyzed by the Encoder NN (Analysis Network 301), which outputs a new representation of that input data. The new representation may be more compressible. This new representation may then be quantized, by a quantizer 305, to a discrete number of values. The quantized data is then lossless encoded, for example by an arithmetic encoder 306, thus obtaining a bitstream 307.

The example shown in FIG. 3 includes an arithmetic decoder 308 and an arithmetic encoder 306. The arithmetic encoder 306, or the arithmetic decoder 308, or the combination of the arithmetic encoder 306 and arithmetic decoder 308 may be referred to as arithmetic codec in some embodiments. On the decoding side, the bitstream is first lossless decoded, for example, by using the arithmetic codec decoder 308. The lossless decoded data is dequantized and then input to the Decoder NN, Synthesis Network 302. The output is the reconstructed or decoded data 309.

In case of lossy compression, the lossy steps may comprise the Encoder NN and/or the quantization.

In order to train this system, a training objective function (also called "training loss") may be utilized, which may comprise one or more terms, or loss terms, or simply losses. In one example, the training loss comprises a reconstruction loss term and a rate loss term. The reconstruction loss encourages the system to decode data that is similar to the input data, according to some similarity metric. Examples of reconstruction losses are:

- Mean squared error (MSE).
- Multi-scale structural similarity (MS-SSIM)
- Losses derived from the use of a pretrained neural network. For example, error (f1, f2), where f1 and f2 are the features extracted by a pretrained neural network for the input data and the decoded data, respectively, and error( ) is an error or distance function, such as L1 norm or L2 norm.
- Losses derived from the use of a neural network that is trained simultaneously with the end-to-end learned codec. For example, adversarial loss can be used, which is the loss provided by a discriminator neural network that is trained adversarially with respect to the codec, following the settings proposed in the context of Generative Adversarial Networks (GANs) and their variants.

The rate loss encourages the system to compress the output of the encoding stage, such as the output of the arithmetic encoder. By "compressing", reducing the number of bits output by the encoding stage is meant.

When an entropy-based lossless encoder is used, such as an arithmetic encoder, the rate loss typically encourages the output of the Encoder NN to have low entropy. Example of rate losses are the following:

- A differentiable estimate of the entropy.
- A sparsification loss, i.e., a loss that encourages the output of the Encoder NN or the output of the quantization to have many zeros. Examples are L0 norm, L1 norm, L1 norm divided by L2 norm.
- A cross-entropy loss applied to the output of a probability model, where the probability model may be a NN used to estimate the probability of the next symbol to be encoded by an arithmetic encoder.

One or more of reconstruction losses may be used, and one or more of the rate losses may be used, as a weighted sum. The different loss terms may be weighted using different weights, and these weights determine how the final system performs in terms of rate-distortion loss. For example, if more weight is given to the reconstruction losses with respect to the rate losses, the system may learn to compress less but to reconstruct with higher accuracy (as measured by a metric that correlates with the reconstruction losses). These weights may be considered to be hyper-parameters of the training session, and may be set manually by the person designing the training session, or automatically for example by grid search or by using additional neural networks.

Figure 4:
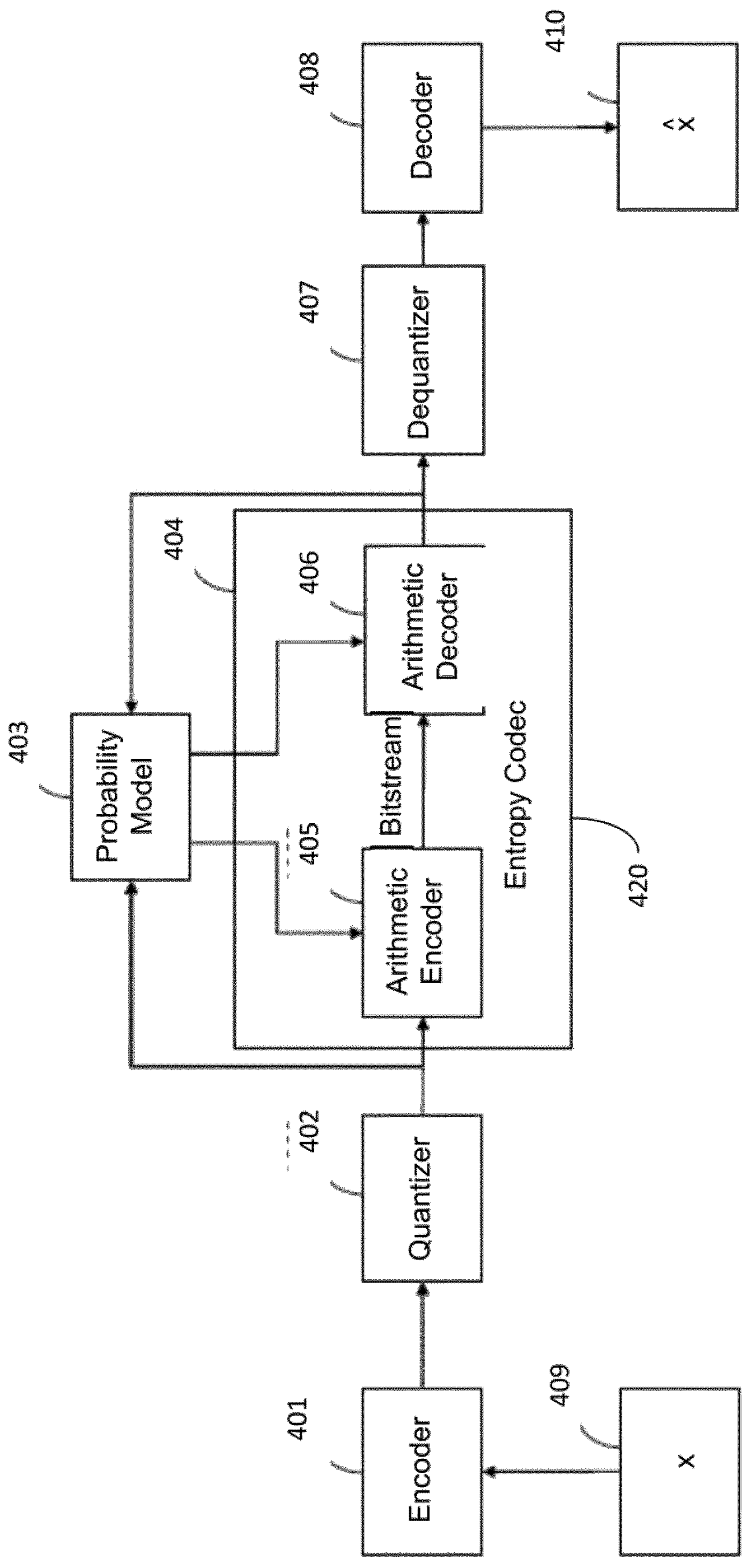
FIG. 4 shows an example of a neural network-based end-to-end learned video coding system.

As shown in FIG. 4, a neural network-based end-to-end learned video coding system may contain an encoder 401, a quantizer 402, a probability model 403, an entropy codec 420 (for example arithmetic encoder 405/arithmetic decoder 406), a dequantizer 407, and a decoder 408. The encoder 401 and decoder 408 may be two neural networks, or mainly comprise neural network components. The probability model 403 may also comprise mainly neural network components. Quantizer 402, dequantizer 407 and entropy codec 420 may not be based on neural network components, but they may also comprise neural network components, potentially.

On encoder side, the encoder component 401 takes a video x 409 as input and converts the video from its original signal space into a latent representation that may comprise a more compressible representation of the input. In the case of an input image, the latent representation may be a 3-dimensional tensor, where two dimensions represent the vertical and horizontal spatial dimensions, and the third dimension represent the "channels" which contain information at that specific location. If the input image is a 128×128×3 RGB image (with horizontal size of 128 pixels, vertical size of 128 pixels, and 3 channels for the Red, Green, Blue color components), and if the encoder downsamples the input tensor by 2 and expands the channel dimension to 32 channels, then the latent representation is a tensor of dimensions (or "shape") 64×64×32 (i.e., with horizontal size of 64 elements, vertical size of 64 elements, and 32 channels). Please note that the order of the different dimensions may differ depending on the convention which is used; in some cases, for the input image, the channel dimension may be the first dimension, so for the above example, the shape of the input tensor may be represented as 3×128×128, instead of 128×128×3. In the case of an input video (instead of just an input image), another dimension in the input tensor may be used to represent temporal information.

The quantizer component 402 quantizes the latent representation into discrete values given a predefined set of quantization levels. Probability model 403 and arithmetic codec component 420 work together to perform lossless compression for the quantized latent representation and generate bitstreams to be sent to the decoder side. Given a symbol to be encoded into the bitstream, the probability model 403 estimates the probability distribution of all possible values for that symbol based on a context that is constructed from available information at the current encoding/decoding state, such as the data that has already been encoded/decoded. Then, the arithmetic encoder 405 encodes the input symbols to bitstream using the estimated probability distributions.

On the decoder side, opposite operations are performed. The arithmetic decoder 406 and the probability model 403 first decode symbols from the bitstream to recover the quantized latent representation. Then the dequantizer 407 reconstructs the latent representation in continuous values and pass it to decoder 408 to recover the input video/image. Note that the probability model 403 in this system is shared between the encoding and decoding systems. In practice, this means that a copy of the probability model 403 is used at encoder side, and another exact copy is used at decoder side.

In this system, the encoder 401, probability model 403, and decoder 408 may be based on deep neural networks. The system may be trained in an end-to-end manner by minimizing the following rate-distortion loss function:

$$L = D + \lambda R,$$

where D is the distortion loss term, R is the rate loss term, and A is the weight that controls the balance between the two losses. The distortion loss term may be the mean square error (MSE), structure similarity (SSIM) or other metrics that evaluate the quality of the reconstructed video. Multiple distortion losses may be used and integrated into D, such as a weighted sum of MSE and SSIM. The rate loss term is normally the estimated entropy of the quantized latent representation, which indicates the number of bits necessary to represent the encoded symbols, for example, bits-per-pixel (bpp).

For lossless video/image compression, the system may contain only the probability model 403 and arithmetic encoder/decoder 405, 406. The system loss function contains only the rate loss, since the distortion loss is always zero (i.e., no loss of information).

A convolutional neural network consists of one or more convolutional layers. The input tensor to a convolutional layer is convolved by one or more filters, also known as kernels, that are defined by a number of weights. At each spatial location of the input tensor, the elements with the same shape as the filter around the location are collected to perform an inner product with the filter and generate the output for that location. Given an input tensor with the shape C×H×W, where C is the number of channels, H is the height, and W is the width, and D filters in a convolutional layer, the output may be a tensor of a shape D×H×W. The shape of the output tensor may be affected by other convolutional parameters, for example, the stride and the padding parameters. After the convolution operation, the convolutional layer may add a bias to the output of the convolution operation and then apply a nonlinear activation function, for example, rectified linear unit (ReLU) to generate the output of the convolutional layer.

The inner product of two tensors is the summation of the products of the elements in the two input tensors. For example, let $x=[x_1, x_2, \ldots, x_d]$ and $w=[w_1, w_2, \ldots, w_d]$ be the flattened vector of the two input tensors. The inner product of x and w is defined as $$(x \cdot w) = \sum_{i=1}^{d} x_i w_i$$

A fully connected layer in a neural network may be considered a convolutional layer where the size of the kernel is the same as the input tensor.

Inner product operation may also be used in matrix multiplication. Matrix multiplication may be performed by computing the inner products of the row vectors of the first matrix and the column vectors of the second matrix.

Numerical stability is a property of a mathematical algorithm that describes the deviation of the system outputs caused by small errors, fluctuation and/or changes to the input data or computing environment. It is a critical property for video coding systems. In this disclosure, the numerical stability issues are focused on the decoding process, where the instability is caused by the differences in the environments and the decoding process. With a numerically stable video coding system, a compressed bitstream shall be decoded correctly (i.e., as expected by the encoder) by decoders running in different environments. There can be two levels of numerical stability for video coding systems:

1) The decoded videos under different environments have the same level of visual quality, which also matches the intended visual quality of the encoding process. It is to be noticed that the decoded videos may differ from each other even though the visual qualities are the same or very close.
2) The decoders generate the same outputs under different environments.

At the first level, the performance of a video coding system remains consistent in different environments and the small deviation of the output does not affect the practical usage of the system, especially when the decoded video is watched by a human. However, the system may have problems with some conformance tests when the exact output is expected.

The numerical stability problem for a video coding system may be caused by inaccuracy of floating-point number calculation, limitation of the precision of the floating-point numbers, and/or limited range of the numerical computing environment. The main cause of the problem is related to floating-point arithmetic. Deep neural networks may rely on floating-point number calculation because of the nonlinear functions in the system and the mechanism of backpropagation used in training. Furthermore, they benefit from hardware that supports parallel computing. The implementation of parallel computing also has dramatic impacts on numerical stability.

Computing architectures for neural network inference, such as graphics processing units (GPUs), may use floating point arithmetic. As a consequence, when neural network inference is performed on different computing architectures, the intermediate and/or final outputs of the neural network might not be bit-exact among difference computing architectures, i.e., different computing architectures may output slightly different values for the same input.

Neural networks running in different environments, including mathematical libraries, device drivers and hardware platforms, may generate different outputs from the same input. The difference may be caused by various reasons, for example, the configuration of the compiler, the difference in the numeric standards, and/or the hardware architecture.

The differences may be especially evident when rounding operations are performed on the values output from the neural network, for example for quantizing the values to a discrete (or anyway smaller) set of values. For example, slightly different values may be quantized to different quantized values when they fall on two different sides of a quantization boundary.

Another case where small differences in floating-point number may cause bigger differences in the final output of a process or neural network is when the number is input to a function which has high first derivative value in correspondence of that input number.

For a neural network, although the difference of the floating-point number output by an operation is small under different environments, the effect to the video coding systems can be catastrophic due to the complexity of the system, which may amplify the small differences into bigger differences in the final output of the system. Consequently, due to the potential propagation and magnification of the drift, it is challenging to integrate neural network inference relying on floating point arithmetic into a video codec.

In the following, some examples (Case 1-Case 6) of the problems caused by unstable behaviour when neural networks are used in video coding systems are described:

Case 1:

When a neural network is used as the decoder of an end-to-end learned video coding system, or for performing a decoder-side operation within a traditional video coding system such as an in-loop filter or a post-processing filter, the output of the neural network is rounded to discrete values to generate the final output. When the two values output by an operation in the two environments are close to a decision boundary of the rounding operation, they can be rounded to different integers on different environments because of the small variations. For example, let's assume that the values in the two environments are 0.499999 and 0.500001, these values may be then rounded to 0 and 1, respectively, although the difference between the two numbers before rounding is very small. This causes the pixel values of the output, the decoded image or a video frame to differ by 1 on the two different environments. The systems having this problem may only achieve the first level of numerical stability.

Case 2:

A probability model is a component that runs on both the encoder and decoder side of a video coding system. The probability model may be used for providing an estimate of a probability for a symbol to be encoded or decoded by a lossless encoder or decoder, such as an entropy encoder or entropy decoder. If the probability model behaves differently at encoding and decoding stages, for example, giving different probability distribution functions when running on different hardware and/or software environments, the encoded bitstream may not be correctly decoded. This is a major issue with entropy decoding, since an error at one point can ruin the most of the decoding process. In this case, the system may output corrupted images or video frames.

Case 3:

Video coding algorithms include different types of prediction, such as temporal motion-compensated prediction and intra prediction. Thus, any differences (a.k.a. drift) in the reconstructed signal between the encoder and the decoder may propagate temporally, spatially and across different scalability layers (e.g., from an independent layer to a spatial enhancement layer, or from a first view to a second view of a multiview video).

Examples of drift propagation caused by temporal and intra predication are provided in this paragraph. In a video coding system, the encoder and decoder use the same set of reference frames or reference blocks (a block is a patch or portion of an image or video frame, such as the "Coding Tree Unit" or "CTU" concept in video codecs) as the context information when encoding/decoding a certain frame or block. For example, the decoder may perform inter-frame prediction, where a frame is predicted from one or more previously reconstructed frames. In another example, the decoder may perform intra-frame prediction, where one block (CTU) may be predicted from one or more previously reconstructed blocks (CTUs). When the encoder and the decoder run on different environments, one or more reference frames, or one or more reference blocks, may be different because of the reasons shown in case 1 and/or case 2. The error may propagate through the decoding process and result in a corrupted reconstructed block or a corrupted set of blocks or a corrupted frame or even a corrupted sequence of video frames.

In cross-component linear model (CCLM), the chroma components of a block are predicted from the respective luma component using a linear model wherein model parameters are derived from the reconstructed luma sample values. The linear model transforms subsampled luma-samples $rec'_L$ into chroma prediction through $P(i, j)=a\cdot rec'_L(i, j)+b$, where the parameters a and b are derived from neighboring luma and chroma samples as $a=(Y_l-Y_s)/(X_l-X_s)$ and $b=Y_s-a\cdot X_s$ with $X_l$ and $X_s$ denoting the average of the two largest and the two smallest neighboring samples, respectively, and $Y_l$ and $Y_s$ denoting the average of the corresponding chroma sample pairs, respectively. CCLM causes a propagation from any luma drift to chroma components.

Also, because of the linear prediction model, if a is large, the luma drift may be amplified in the chroma domain.

Case 4:

Some video coding algorithms include different types of non-linear operations, such as sample adaptive offset and luma mapping. Thus, any difference in the reconstructed signal between the encoder and the decoder may cause a non-linear magnification of the difference.

Case 5:

Some video coding algorithms include coding tools based on the decoder-side template matching. For example, a motion vector of a block may be refined in decoder-side so that the sample value differences across the boundaries of the block reconstructed using the motion vector relative to the previously reconstructed blocks are minimized. Even a slight difference in reconstructed sample values between the encoder and the decoder may therefore cause a wrong derivation resulting from the decoder-side template matching.

Case 6:

Numerical instability may propagate between layers of a neural network (e.g., from a first layer of a neural network to a second layer) that is used in a video or image codec. Since a node of a network may have many connections to other nodes, the propagation may extend layer by layer in terms of number of nodes affected by a numerical instability difference. Since neural networks may use multiplicative weights, the differences may be magnified. Some operations in a neural network, such as sigmoid, hyperbolic tangent, and softmax functions, may be non-linear and may therefore cause a non-linear impact resulting from the differences causes by numerical instability. Some non-linear activation functions such as Parametric Rectified Linear Unit (PReLu) may be characterized by a high first derivative value in at least a portion of the input range (for PReLU, the whole negative input range, when the value of the learnable slope parameter is high), which may cause small input errors to become bigger output errors.

Video codecs, such as HEVC/H.265 and VVC/H.266 avoid the unstable behaviour of the decoder or probability model by prohibiting floating-point arithmetic at the decoder side. So, only integer arithmetic is allowed in the decoder or probability model.

Neural network-based video coding systems are still at an early developing phase. The numerical stability issues of the decoder and the probability model have not been well studied. The most relevant study is about integer or discrete neural networks, which aims at fast inference, small model size and cheap hardware platform. The full integer neural network, where both model parameters and activation maps are in integer format can solve the problem caused by various difficulties related to floating-point number arithmetic. However, the neural networks always contain nonlinear functions, for example, sigmoid, hyperbolic tangent, and softmax function, which makes the integer neural network difficult to train. Post-training quantization to integers may be possible. However, the integer neural networks may not achieve the same accuracy as floating-point neural networks. For example, when used for classification tasks, the integer neural networks have a few percent lower accuracy compared to floating-point neural networks. Furthermore, currently only few hardware acceleration architectures support inference of integer neural networks.

The present embodiments aim to perform post-training quantization for certain operations and certain data in a floating-point NN to achieve bit-exact outputs in different environments.

Some of the embodiments use a precision allocation factor (PAF) to allocate the precision levels for the two sets of operands given the overall precision limit of the system. In some of the embodiments, the PAF is determined from the statistics of one set of operands and the number of elements involved in the calculation.

Some embodiments use a mixture of precision levels on the two sets of operands when performing the calculation.

Some embodiments use a series of low precision arithmetic operations to achieve high precision results.

One example of a source of numerical instability is explained in this paragraph. Some mathematical operations are commutative in theory, which means that changing the order or operands does not change the result. For example, mathematically, a+b+c provides the same result as c+b+a, and a×b×c provides the same result as c×b×a (where × is a multiplication sign). However, in practice, due to the limitation of the computing environments, for example, precision and range limit, the operation may become non-commutative, i.e., the results may be different when the order of the operands is changed and the intermediate results experience rounding error, overflow, or saturation.

Unary and binary arithmetic operators, such as summation and products, may generate the same results in different environments if the systems follow the same standard for arithmetic representation and computation, for example, IEEE 754 (2019). However, operations with more than two operands involved, such as the inner products of two vectors, may generate different results in different environments due to the non-commutative property of the operation.

The inner product operation involves two types of arithmetic operations, multiplication of pairs of numbers and summation of two or more numbers. Since the order of summation for more than two numbers may not be the same in different environments, the summation operation over more than two operands may be non-commutative and different computing environments may yield different results due to the precision limit and the range limit of the numerical representation. To achieve a numerically stable calculation of the inner product, the operands shall be scaled properly and quantized into integers. Next, the inner product may be performed in an integer domain. The proper scaling ensures that no intermediate results during the calculation may go beyond the range limit of the numerical system. The calculation in the integer domain ensures that the precision limitation is the same for all computing environments.

In one embodiment, the elements in the input tensor to a convolution layer are scaled by an input scaling factor (ISF) and rounded to the nearest integers and the weight elements of the filters in the convolution layer are scaled by a weight scaling factor (WSF) and rounded to the integers. The convolution is performed in the integer domain to result in an integer output tensor. After the convolution operation, the integer output tensor is converted to a floating-point output tensor and scaled by the inverse of the product of the ISF and WSF. The bias term and the nonlinear operation of the convolutional layer may be applied to the floating-point output tensor using floating-point numbers and operations.

Precision Allocation Factor

The range limit of an integer number format may be determined by the number of significant bits. For example, the range limit of an integer number in single-precision floating-point number format (binary 32) defined in IEEE 754 (2019) is from $-2^{24}$ to $2^{24}$, the range limit of an integer number in double-precision floating-point number format (binary64) defined in IEEE 754 (2019) is from $-2^{53}$ to $2^{53}$, the range limit of a 32-bit integer number is $-2^{31}$ to $2^{31}-1$. Let U be the range limit for a numerical format, i.e., the number between −U and U can be precisely presented. For the inner product calculation, the ISF and WSF shall be defined properly to avoid overflow during the calculation.

Let x and w be the two vectors involved in the inner product operation. For a convolution operation, x is the input tensor and w is the weight tensor of a filter. For a fully connected layer, x is the input tensor and w is the weight tensor of the fully connected layer. Let $U_x$ and $U_w$ be the input range limit (IRL) and weight range limit (WRL) for the operands x and w respectively. To avoid overflow during the calculation, the product of IRL and WRL shall be less than or equal to the range limit U, i.e., $U_x U_w \le U$.

In one embodiment, the ISF $f_x$ is defined as $$f_x = \frac{U_x - 0.5}{|x|_{max}}$$

where $|x|_{max}$ is the maximum value of the absolute values of the elements in x. The WSF $f_w$ is defined as $$f_w = \frac{U_w - e}{|w|_{sum}}$$

where e is the adjustment value and $|w|_{sum}$ is the sum of the absolute value of the elements in w.

According to an embodiment, e=N/2, where N is the number of elements in w. This is to prevent the overflow in the case where every scaled element of w would be round up by 0.5 (maximum rounding amount) to the nearest integer.

According to another embodiment, the value e may be determined in the following iterative procedure.

Given initial value e, and step value t 1. let $e=e_0$
2. calculate $$f_w = \frac{U_w - e}{|w|_{sum}}$$

3. if $\text{sum}(\text{round}(f_w \cdot |w_i|)) > U_w$
   let $e=e-t$
   go back to step 2

According to one embodiment, the precision allocation factor (PAF) is used to determine the IRL and WRL to achieve the best precision during the calculation. Given the PAF s, IRL $U_x$ and WRL $U_w$ are calculated by $U_x = s\sqrt{U}$ and $$U_w = \frac{1}{s}\sqrt{U},$$

respectively.

According to one embodiment, the PAF is determined based at least on the maximum value of the absolute values of the elements in the input vector, the mean value of the absolute values of the elements in the input vector and the number of elements in the weight tensor, for example, by equation $$s = \sqrt{\frac{|x|_{max}}{|x|_{mean} N}}$$

According to another embodiment, the PAF is determined based at least on the number of elements in the weight tensor and a predefined constant number, for example, by equation $$s = \sqrt{\frac{c}{N}}$$

where is c a constant number that may be determined by the statistics of the input tensors using a training dataset.

In another embodiment, constant c may be determined at the encoder side and signaled to the decoder.

Mixture of Precision Calculation

Since the calculation precision is affected by the statistical information, for example, mean and maximum value of the absolute values of the input tensor, the input tensor may be partitioned into multiple subtensors and the convolution may be performed on each subtensor using the PAF parameter defined according to the values in the subtensor.

According to one embodiment, an input tensor is partitioned into multiple subtensors according to the maximum value of the absolute values of the elements in each channel. In one example, the maximum value of the absolute values of the elements in each channel of the input tensor x is calculated. The first subtensor $x^{(1)}$, named as significant subtensor, contains the channels in x where the maximum value of the absolute values is higher than a predefined threshold and the second subtensor $x^{(2)}$, named as insignificant subtensor, contains the other channels in x. Filter w is partitioned into two filters $w^{(1)}$ and $w^{(2)}$ based on the same procedure used to partition the input tensor. Convolution may be performed on $x^{(1)}$ and $x^{(2)}$ with filter $w^{(1)}$ and $w^{(2)}$ respectively using PAF, IRL and WRL parameters determined for each subtensor.

According to another embodiment, the input tensor is partitioned into multiple subtensors according to the ratio of the maximum value of the absolute values of the input tensor and the mean value of the absolute values of the input tensor, for example $$\frac{|x|_{max}}{|x|_{mean}}.$$

According to one example, the significant subtensor contains the channels in the input tensor wherein the ratio is higher than a predefined threshold and the insignificant subtensor contains the other channels.

According to another embodiment, the input tensor is partitioned into multiple subtensors according to the maximum value of the absolute values of the input tensor. According to one example, the significant subtensor contains the channels in the input tensor wherein the maximum value is higher than a predefined threshold and the insignificant subtensor contains the other channels.

According to some embodiments, the partitioning may be performed along the channel dimension of the input tensor. The output of the convolution is generated by summing up the outputs of the convolution on each subtensor.

According to some embodiments, the partitioning may be performed along the spatial dimension of the input tensor. The output of the convolution is generated by concatenating the outputs of the convolution of each subtensors.

According to some embodiments, different range limits may be used for different subtensors. In one example, a higher value of range limit is used for significant subtensor and a lower range limit is used for insignificant subtensor. For example, the convolution of the significant subtensor is performed using the integers represented in double-precision floating-point numbers and the convolution of the insignificant subtensor is performed using integers represented in single-precision floating-point numbers.

In the case where the precision of the computing environment is limited, for example the range limit U is fixed, the calculation of the convolution with a higher precision may be performed by combining the results of convolution calculation using a lower precision.

According to an embodiment, an input tensor x is first scaled by ISF $f_x$ and quantized to tensor $\hat{x}$. A residual tensor may be calculated by $$\tilde{x} = x - \frac{\hat{x}}{f_x}.$$

The output of the convolution using a higher precision, for example, a larger range limit, may be calculated as the summation of the convolution of input tensor x and residual tensor x using a lower precision, for example, a smaller range limit. This procedure may be repeated multiple times to achieve a desired precision for the calculation.

In the table below, the performance of a system using some of the embodiments is illustrated. An end-to-end learned image coding system is trained using floating-point numbers. The codec is comprised of NN-based encoder, decoder and probability model. At the inference stage, i.e., encoding and decoding, the convolution in the probability model is performed in the integer domain to make the bitstreams decodable in different environments using embodiments described in this disclosure. The following table shows the results in the bit-per-pixel (BPP), PSNR, rate-distortion loss and decoding time when the convolution is performed in different numeric formats. 24 images are used for the evaluation and the metrics are presented as the average of all testing images. The float format indicates that convolutions are performed using floating-point numbers. Note that the bitstream generated using the float format may not be decoded correctly in a different environment.

| Format | BPP | PSNR | Rate-distortion loss | Decoding time (second) |
|---|---|---|---|---|
| float | 0.265 | 31.03 | 6.05E−3 | 0.29 |
| Integer(float64) | 0.265 | 31.03 | 6.05E−3 | 0.62 |
| Integer(float32) | 0.266 | 31.04 | 6.06E−3 | 0.39 |
| Integer(mixture) | 0.266 | 31.04 | 6.05E−3 | 0.39 |

The results show that using the integer operation according to the present embodiments, the system performance is retained with some small increases in the decoding time.

Figure 5:
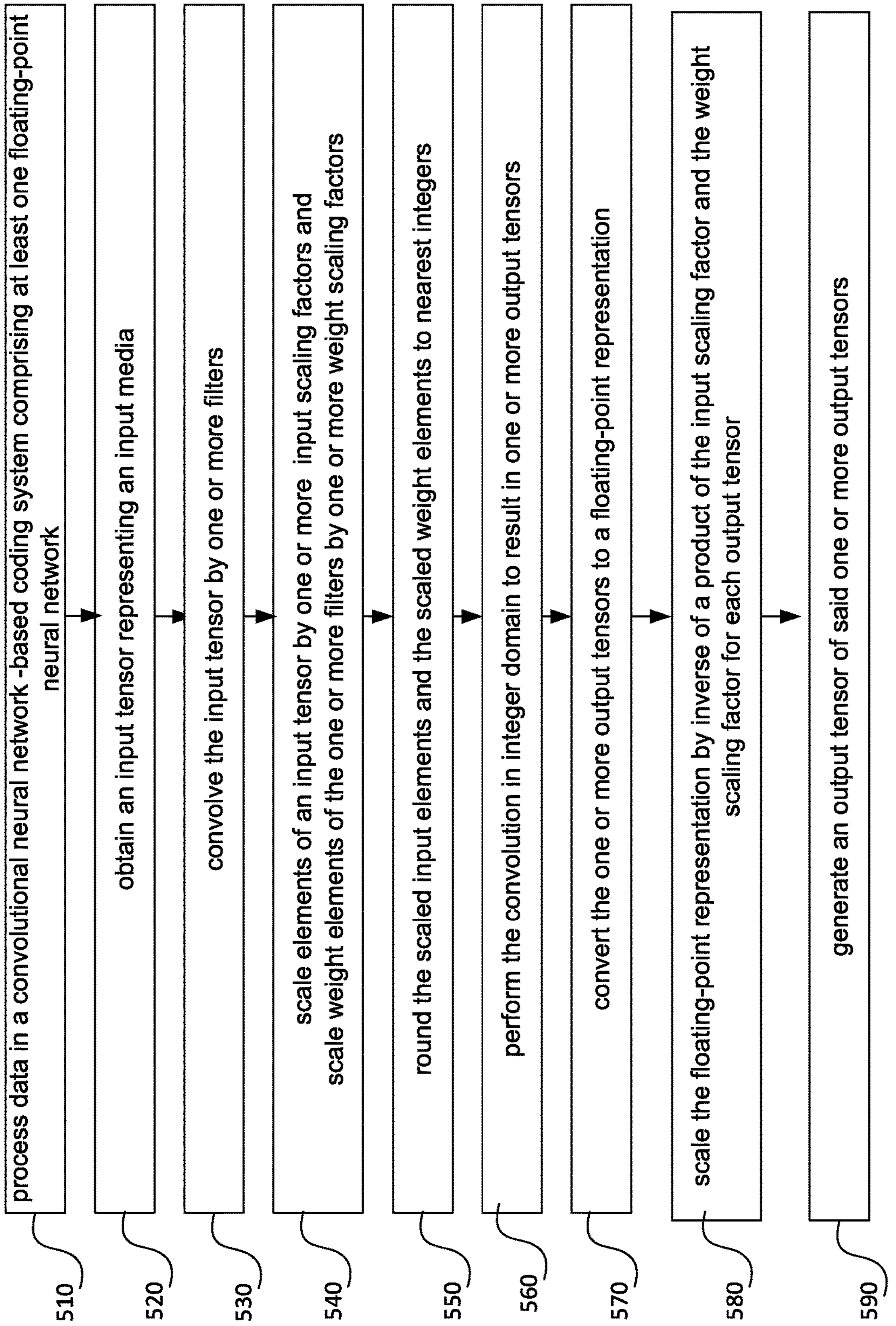
FIG. 5 is a flowchart illustrating a method according to an embodiment.

The method according to an embodiment is shown in FIG. 5. The method generally comprises processing 510 data in a convolutional neural network-based coding system comprising at least one floating-point neural network; obtaining 520 an input tensor representing an input media; convolving 530 the input tensor by one or more filters; wherein the method further comprises scaling 540 elements of an input tensor by one or more input scaling factors; scaling 540 weight elements of the one or more filters by one or more weight scaling factors; rounding 550 the scaled input elements and the scaled weight elements to nearest integers; performing 560 the convolution in integer domain to result in one or more output tensors; converting 570 the one or more output tensors to a floating-point representation; scaling 580 the floating-point representation by inverse of a product of the input scaling factor and the weight scaling factor for each output tensor; and generating 590 an output tensor of said one or more output tensors. Each of the steps can be implemented by a respective module of a computer system.

An apparatus according to an embodiment comprises means for processing data in a convolutional neural network-based coding system comprising at least one floating-point neural network; means for obtaining an input tensor representing an input media; means for convolving the input tensor by one or more filters; wherein the apparatus further comprises means for scaling elements of an input tensor by one or more input scaling factors; means for scaling weight elements of the one or more filters by one or more weight scaling factors; means for rounding the scaled input elements and the scaled weight elements to nearest integers; means for performing the convolution in integer domain to result in one or more output tensors; means for converting the one or more output tensors to a floating-point representation; means for scaling the floating-point representation by inverse of a product of the input scaling factor and the weight scaling factor for each output tensor; and means for generating an output tensor of said one or more output tensors. The means comprises at least one processor, and a memory including a computer program code, wherein the processor may further comprise processor circuitry. The memory and the computer program code are configured to, with the at least one processor, cause the apparatus to perform the method of FIG. 5 according to various embodiments.

Figure 6:
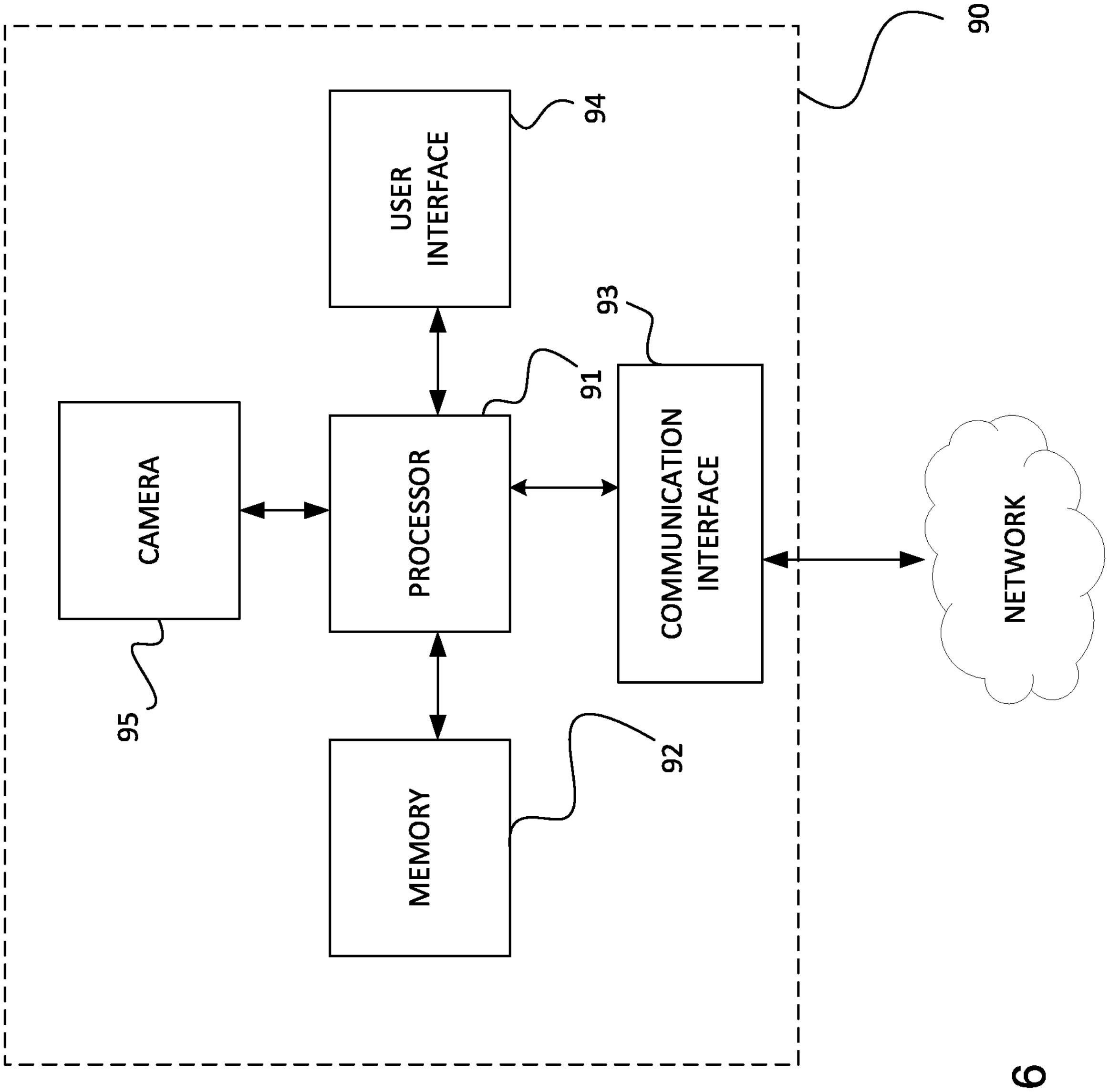
FIG. 6 shows an apparatus according to an embodiment.

FIG. 6 illustrates an example of an apparatus. The apparatus is a user equipment for the purposes of the present embodiments. The apparatus 90 comprises a main processing unit 91, a memory 92, a user interface 94, a communication interface 93. The apparatus according to an embodiment, shown in FIG. 6, may also comprise a camera module 95. Alternatively, the apparatus may be configured to receive image and/or video data from an external camera device over a communication network. The memory 92 stores data including computer program code in the apparatus 90. The computer program code is configured to implement the method according various embodiments by means of various computer modules. The camera module 95 or the communication interface 93 receives data, in the form of images or video stream, to be processed by the processor 91. The communication interface 93 forwards processed data, i.e. the image file, for example to a display of another device, such a virtual reality headset. When the apparatus 90 is a video source comprising the camera module 95, user inputs may be received from the user interface.

The various embodiments can be implemented with the help of computer program code that resides in a memory and causes the relevant apparatuses to carry out the method. For example, a device may comprise circuitry and electronics for handling, receiving and transmitting data, computer program code in a memory, and a processor that, when running the computer program code, causes the device to carry out the features of an embodiment. Yet further, a network device like a server may comprise circuitry and electronics for handling, receiving and transmitting data, computer program code in a memory, and a processor that, when running the computer program code, causes the network device to carry out the features of various embodiments.

If desired, the different functions discussed herein may be performed in a different order and/or concurrently with other. Furthermore, if desired, one or more of the above-described functions and embodiments may be optional or may be combined.

Although various aspects of the embodiments are set out in the independent claims, other aspects comprise other combinations of features from the described embodiments and/or the dependent claims with the features of the independent claims, and not solely the combinations explicitly set out in the claims.

It is also noted herein that while the above describes example embodiments, these descriptions should not be viewed in a limiting sense. Rather, there are several variations and modifications, which may be made without departing from the scope of the present disclosure as, defined in the appended claims.

The invention claimed is:

1. An apparatus comprising: at least one processor; and at least one memory storing instructions that, when executed by the at least one processor, cause the apparatus at least to perform: processing data in a convolutional neural network-based coding system comprising at least one floating-point neural network; obtaining an input tensor representing an input media; convolving the input tensor by one or more filters; wherein the apparatus is further caused to perform: scaling elements of an input tensor by one or more input scaling factors; scaling weight elements of the one or more filters by one or more weight scaling factors; rounding the scaled input elements and the scaled weight elements to nearest integers; performing the convolution in integer domain to result in one or more output tensors; converting the one or more output tensors to a floating-point representation; scaling the floating-point representation by inverse of a product of the input scaling factor and the weight scaling factor for each output tensor; and generating an output tensor of said one or more output tensors.

2. The apparatus according to claim 1, wherein the instructions stored in the at least one memory, when executed by the at least one processor, further cause the apparatus to perform: using a precision allocation factor for allocating precision levels for the elements of the input tensor and the weight elements.

3. The apparatus according to claim 2, wherein the precision allocation factor is determined based at least on the maximum value of elements in the input tensor, the mean value of the absolute values of the elements in the input tensor, and the number of elements in the weight tensor.

4. The apparatus according to claim 2, wherein the precision allocation factor is determined based at least on the number of weight elements, and a predefined constant number.

5. The apparatus according to claim 1, wherein the instructions stored in the at least one memory, when executed by the at least one processor, further cause the apparatus to perform: partitioning an input tensor into multiple subtensors; and partitioning a weight tensor into multiple weight subtensors, wherein the multiple subtensors represent the elements of the input tensors, and wherein the multiple weight subtensors represent the weight elements, whereupon the convolution operation is performed for each pair of input subtensor and weight subtensor in integer domain to result in one or more output subtensors, whereupon the one or more output subtensors are converted to a floating-point representation, and the output subtensors are combined into an output tensor.

6. The apparatus according to claim 5, wherein the input scaling factor and the weight scaling factor is derived from the precision allocation factor for each pair of the subtensors.

7. The apparatus according to claim 5, wherein the input tensor is partitioned at least according to: the ratio of the maximum value of the absolute values of the input tensor, the mean value of the absolute values of the input tensor, and a predefined threshold value; or the maximum value of the absolute values of the input tensor, and a predefined threshold value.

8. A method, comprising: processing data in a convolutional neural network-based coding system comprising at least one floating-point neural network; obtaining an input tensor representing an input media; convolving the input tensor by one or more filters; wherein the method further comprises: scaling elements of an input tensor by one or more input scaling factors; scaling weight elements of the one or more filters by one or more weight scaling factors; rounding the scaled input elements and the scaled weight elements to nearest integers; performing the convolution in integer domain to result in one or more output tensors; converting the one or more output tensors to a floating-point representation; scaling the floating-point representation by inverse of a product of the input scaling factor and the weight scaling factor for each output tensor; and generating an output tensor of said one or more output tensors.

9. The method according to claim 8, further comprising: using a precision allocation factor for allocating precision levels for the elements of the input tensor and the weight elements.

10. The method according to claim 9, wherein the precision allocation factor is determined based at least on the maximum value of elements in the input tensor, the mean value of the absolute values of the elements in the input tensor, and the number of elements in the weight tensor.

11. The method according to claim 9, wherein the precision allocation factor is determined based at least on the number of weight elements, and a predefined constant number.

12. The method according to claim 8, further comprising: partitioning an input tensor into multiple subtensors; and partitioning a weight tensor into multiple weight subtensors, wherein the multiple subtensors represent the elements of the input tensors, and wherein the multiple weight subtensors represent the weight elements, whereupon the convolution operation is performed for each pair of input subtensor and weight subtensor in integer domain to result in one or more output subtensors, whereupon the one or more output subtensors are converted to a floating-point representation, and the output subtensors are combined into an output tensor.

13. The method according to claim 12, wherein the input scaling factor and the weight scaling factor is derived from the precision allocation factor for each pair of the subtensors.

14. The method according to claim 12, further comprising: partitioning an input tensor at least according to: the ratio of the maximum value of the absolute values of the input tensor, the mean value of the absolute values of the input tensor, and a predefined threshold value; or the maximum value of the absolute values of the input tensor, and a predefined threshold value.

15. A non-transitory computer-readable medium comprising instructions, when executed by an apparatus, cause the apparatus at least to perform: processing data in a convolutional neural network-based coding system comprising at least one floating-point neural network; obtaining an input tensor representing an input media; convolving the input tensor by one or more filters; wherein the apparatus is further caused to perform: scaling elements of an input tensor by one or more input scaling factors; scaling weight elements of the one or more filters by one or more weight scaling factors; rounding the scaled input elements and the scaled weight elements to nearest integers; performing the convolution in integer domain to result in one or more output tensors; converting the one or more output tensors to a floating-point representation; scaling the floating-point representation by inverse of a product of the input scaling factor and the weight scaling factor for each output tensor; and generating an output tensor of said one or more output tensors.

16. The computer-readable medium of claim 15, further comprising instructions, when executed by the apparatus, further cause the apparatus to perform: using a precision allocation factor for allocating precision levels for the elements of the input tensor and the weight elements.

17. The computer-readable medium of claim 16, wherein the precision allocation factor is determined based at least on the maximum value of elements in the input tensor, the mean value of the absolute values of the elements in the input tensor, and the number of elements in the weight tensor.

18. The computer-readable medium of claim 16, wherein the precision allocation factor is determined based at least on the number of weight elements, and a predefined constant number.

19. The computer-readable medium of claim 15, further comprising instructions, when executed by the apparatus, further cause the apparatus to perform: partitioning an input tensor into multiple subtensors; and partitioning a weight tensor into multiple weight subtensors, wherein the multiple subtensors represent the elements of the input tensors, and wherein the multiple weight subtensors represent the weight elements, whereupon the convolution operation is performed for each pair of input subtensor and weight subtensor in integer domain to result in one or more output subtensors, whereupon the one or more output subtensors are converted to a floating-point representation, and the output subtensors are combined into an output tensor.

20. The computer-readable medium of claim 19, wherein the input scaling factor and the weight scaling factor is derived from the precision allocation factor for each pair of the subtensors.

* * * * *